FREQUENCY DOUBLER EMPLOYING TWO PUSH-PULL PULSED INTERNAL FIELD EFFECT DEVICES

Filed March 19, 1963 2 Sheets-Sheet 1

INVENTOR.
MILLARD E. AMES, JR.
BY Eugene M. Whitacre
ATTORNEY

INVENTOR.
MILLARD E. AMES, JR.
BY
Eugene M. Whitacre
ATTORNEY 3,202,840
Patented Aug. 24, 1965

3,202,840

FREQUENCY DOUBLER EMPLOYING TWO PUSH-PULL PULSED INTERNAL FIELD EFFECT DEVICES

Millard E. Ames, Jr., Collingswood, N.J., assignor to Radio Corporation of America, a corporation of Delaware Filed Mar. 19, 1963, Ser. No. 266,253
5 Claims. (Cl. 307—88.5)

This invention relates in general to electrical circuits employing semiconductor devices and more particularly to semiconductor frequency conversion circuits such as frequency doublers and the like.

In the prior art, circuits such as frequency doublers use tuned output circuits to eliminate unwanted frequency components (fundamental and harmonics) to provide a substantially pure sine wave output signal of the desired frequency. If a resistance-capacitance output circuit is employed in the known type of frequency doubler, the resulting output signals are not sine waves, and a substantial amount of fundamental and higher order harmonics is present. In some applications, such as integrated circuits, it is important to design frequency doublers and like circuits, which provide a substantially pure sine wave output using resistive and capacitive components only.

Accordingly, it is an object of this invention to provide an improved frequency doubler circuit, which does not require a tuned output circuit to obtain a substantially pure sine wave output signal.

It is another object of this invention to provide an improved frequency multiplier circuit having several stages of frequency multiplication to obtain a substantially pure sine wave output signal at a frequency several octaves higher than the frequency of the input signal without having tuned output circuits.

It is still another object of this invention to provide an improved frequency multiplier circuit having a resistance-capacitance output circuit which provides a substantially pure sine wave output signal having twice the frequency of the input signal, and which substantially eliminates the fundamental frequency and other higher order harmonics.

It is a further object of this invention to provide an improved mixer-frequency-doubler circuit in which the output signal consists of the second harmonic and the sum and difference of the input signals.

An electrical circuit embodying the invention comprises first and second insulated-gate field-effect semiconductor devices each having source, drain and gate electrodes formed on a substrate of semiconductor material. The first and second field-effect semiconductor devices have a signal transfer characteristic that approximates a square law curve. The source-to-drain current paths of the field-effect semiconductor devices are effectively connected in parallel. Input circuit means are respectively coupled to the gate electrodes of the first and second semiconductor devices for applying input signals in push-pull relation. Biasing circuit means are respectively coupled to the gate electrodes of the first and second semiconductor devices so that the first and second semiconductor devices operate in a region of the transfer characteristic that exhibits square law characteristics. Output circuit means is coupled to the drain electrodes of each of the first and second field-effect semiconductor devices to derive an output signal that is the second harmonic of the frequency of the input signals, and which is free of fundamental and higher order frequency distortion.

The novel features which are considered characteristic of the invention are set forth with particularity in the appended claims. The invention itself, however, both as to its organization and method of operation as well as additional objects and advantages thereof will best be understood from the accompanying drawing in which:

Figure 1:
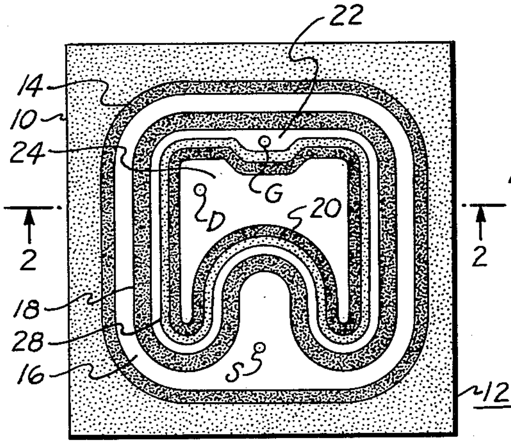
FIGURE 1 is a diagrammatic view of a field-effect transistor suitable for use in circuits embodying the invention.

Referring now to the drawings and particularly to FIGURE 1, a field-effect transistor 10 which may be used with circuits embodying the invention includes a body 12 of semiconductor material. The body 12 may be either a single crystal or polycrystalline and may be of any of the semiconductor materials used to prepare transistors in the semiconductor art. For example, the body 12 may be nearly intrinsic silicon, such as for example lightly doped P-type silicon of 100 ohm-cm. material.

In the manufacture of the device shown in FIGURE 1, heavily doped silicon dioxide is deposited over the surface of the silicon body 12. The silicon dioxide is doped wth N-type impurities. By means of a photo-resist and acid etching, or other suitable technique, the silicon dioxide is removed where the gate electrode is to be formed, and around the outer edges of the silicon wafer as viewed on FIGURE 1. The deposited silicon dioxide is left over those areas where the source and drain regions are to be formed.

Figure 2:
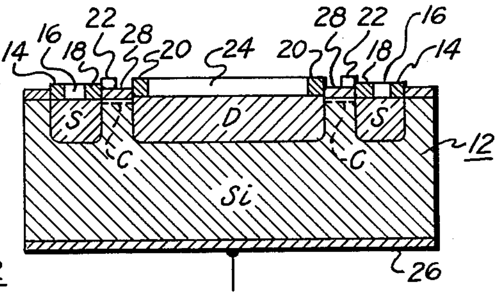
FIGURE 2 is a cross-section view taken along section line 2—2 of FIGURE 1.

The body 12 is then heated in a suitable atmosphere, such as in water vapor, so that exposed silicon areas are oxidized to form grown silicon dioxide layers indicated by the lightly stippled areas of FIGURE 1. During the heating process, impurities from the deposited silicon dioxide layer diffuse into the silicon body 12 to form the source and drain regions. FIGURE 2, which is a cross sectional view taken along section 2—2 of FIGURE 1, shows the source-drain regions labelled S and D respectively.

By means of another photo-resist and acid etching or like step, the deposited silicon dioxide over part of the source-drain diffused regions is removed. Electrodes are formed for the source, drain and gate regions by evaporation of a conductive material by means of an evaporation mask. The conductive material evaporated may be chromium and gold in the order named, for example, but other suitable metals may be used.

The finished wafer is shown in FIGURE 1, in which the lightly stippled area between the outside boundary and the first dark zone 14 is grown silicon dioxide. The white area 16 is the metal electrode corresponding to the source electrode. Dark or more heavily stippled zones 14 and 18 are deposited silicon dioxide zones overlying a portion of the diffused source region, and the dark zone 20 is a deposited silicon dioxide zone overlying a portion of the diffused drain region. White areas 22 and 24 are the metallic electrodes which corresponding to the gate and drain electrodes respectively. The stippled zone 28 is a layer of grown silicon dioxide on a portion of which the gate electrode 22 is placed and which insulates the gate electrode 22 from the substrate silicon body 12 and from the source and drain electrodes as shown in FIGURE 2. The silicon wafer is mounted on a conductive base or header 26 as shown in FIGURE 2. The layer of grown silicon dioxide 28 on which the gate electrode 22 is mounted, overlies an inversion layer or conducting channel C connecting the source and drain regions. The gate electrode 22 is displaced towards the source region S so that the distance between the source region S and the gate electrode 22 is smaller than the distance between the gate electrode 22 and the drain region D. If desired, the gate electrode may overlap the deposited silicon dioxide layer 18.

Figure 3:
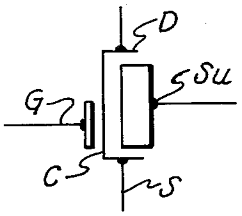
FIGURE 3 is a symbolic representation of an insulated-gate field-effect transistor.

FIGURE 3 is a symbolic representation of the insulated-gate field-effect transistor previously described in FIGURES 1 and 2. There is shown the gate electrode G, the drain electrode D, the source electrode S, and the subtsrate of semiconductor material $S_u$. It should be noted that electrodes D and S operate as the drain and the source electrodes as a function of the polarity of the bias potential applied therebetween; i.e., the electrode to which a positive bias potential is applied (relative to the bias potential applied to the other electrode) operates as a drain electrode, and the other electrode operates as a source electrode.

The drain and source electrodes are connected to each other by a conductive channel C. The majority current carriers (in this case electrons) flow from source to drain in this thin channel region close to the surface. The conductive channel C is shown in FIGURE 2 in dotted lines.

Figure 4:
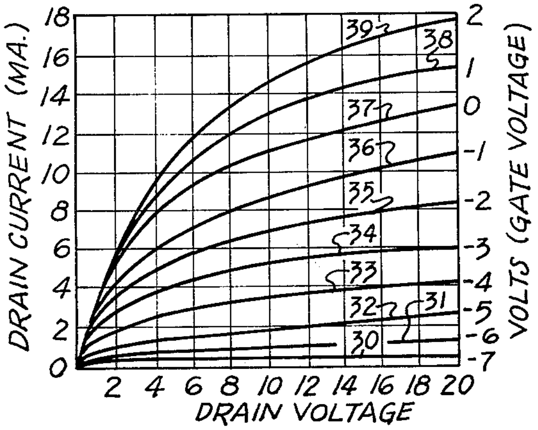
FIGURE 4 is a graph showing a family of drain current versus drain voltage curves, for various values of gate-to-source voltages for the transistor of FIGURE 1.

FIGURE 4 is a family of curves 30–39 illustrating the drain current versus drain voltage characteristic of the transistor of FIGURE 1 for different values of gate-to-source voltage. A feature of an insulated-gate field-effect transistor is that the zero bias characteristic can be at any of the curves 30–39. In FIGURE 4 the curve 37 corresponds to the zero bias gate-to-source voltage. Curves 38 and 39 represent positive gate voltages relative to the source and the curves 30–36 represent negative gate voltages relative to the source.

The location of the zero bias curve is established during the manufacture of the transistor, i.e., by controlling the time or the temperature, or both, during the step of the process in which the silicon dioxide layer 28 shown in FIGURES 1 and 2 is grown.

Figure 5:
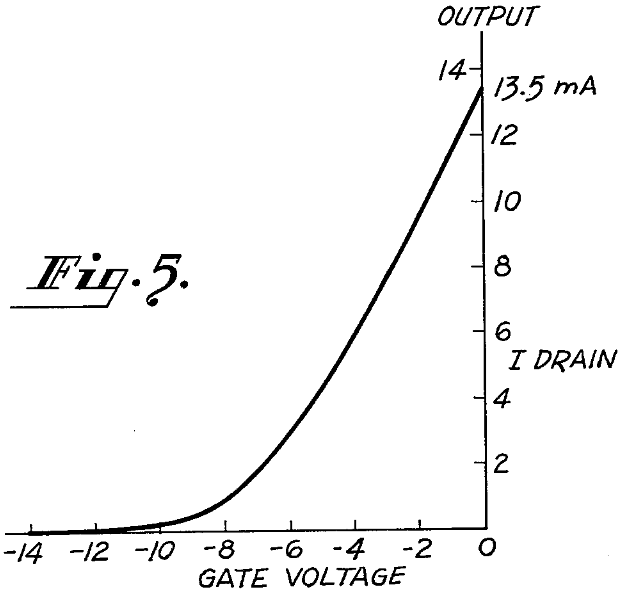
FIGURE 5 is a graph showing the transfer characteristic (drain current versus gate-to-source voltage) of the field-effect transistor shown in FIGURE 1.

Referring now to FIGURE 5 there is shown the drain current versus gate voltage characteristic (signal transfer characteristic) of an insulated-gate field-effect transistor similar to the ones shown in FIGURES 1 and 2 for a given source-to-drain voltage. The signal transfer characteristic may be mathematically expressed as a power series of the form:

$$i=a_0+a_1e+a_2e^2+a_3e^3+\ldots$$

in which:

$$a_1=\frac{di}{de}\bigg|e=o$$

and $$a_n=\frac{1}{n!}\frac{d^ni}{de^n}\bigg|e=o$$

if:

$$e=b\cos\omega t$$

then:

$$i=a_0+a_1b\cos\omega t+a_2\,b^2/2\,(1+\cos 2\omega t)+a_3\,b^3/4\,(3\cos\omega t+\cos 3\omega t)$$

where:

$e$=signal voltage,
$i$=signal current,
$b$=amplitude of signal voltage, and
$\omega$=angular frequency.

Figure 7:
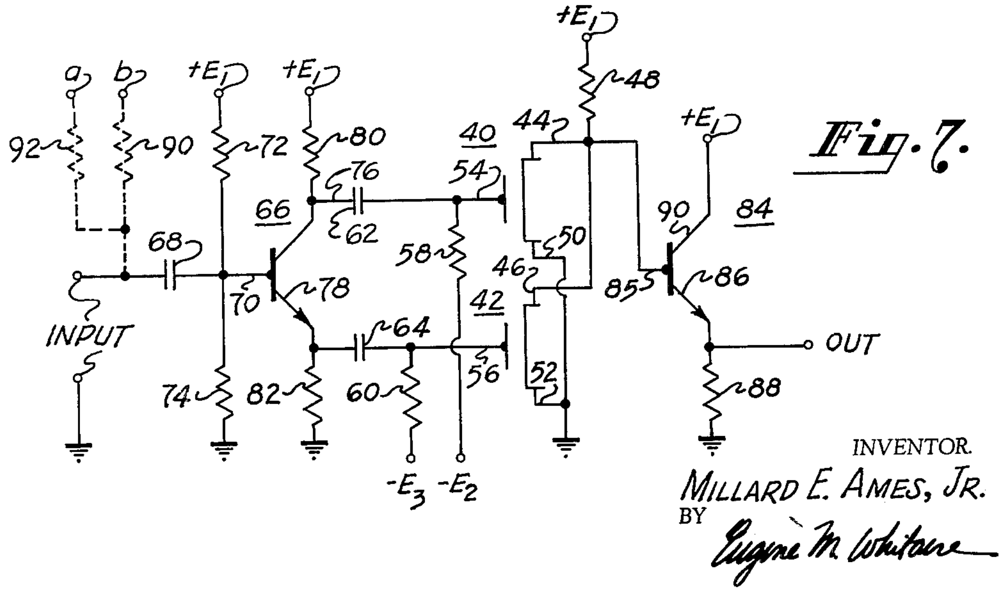
FIGURE 7 is a schematic circuit diagram of a frequency doubler embodying the invention.

Referring now to FIGURE 7 there is shown a frequency doubler circuit including insulated-gate field-effect transistors 40 and 42, which may be similar to the ones shown in FIGURES 1 and 2. The drain electrodes 44 and 46 of the field-effect transistors 40 and 42 are respectively coupled through a resistor 48 to a source of bias potential $+E_1$ (not shown), which may be a battery for example. The source electrodes 50 and 52 of the field-effect transistors 40 and 42 are respectively connected to a point of reference potential shown as ground. The gate electrodes 54 and 56 of field-effect transistors 40 and 42 are biased to desired bias potentials through resistors 58 and 60 respectively from the bias potential sources $-E_2$ and $-E_3$ (not shown). If the signal transfer characteristics of the insulated-gate field-effect transistors 40 and 42 are equal, i.e., if the field-effect transistors 40 and 42 constitute a matched pair, the gate-to-source bias voltage may be equal. If, however, the signal transfer characteristics of the insulated-gate field-effect transistors 40 and 42 differ the transistors 40 and 42 are biased to different bias potentials. In the latter case, either separate bias potential sources may be used, or a single bias source with an appropriate voltage divider network may be involved. The field-effect transistors 40 and 42 may have a signal transfer characteristic that is similar to the signal transfer characteristic shown in FIGURE 5. In such a case the transistors 40 and 42 would be biased to a value of gate voltage around −7 volts, whereby the transistors 40 and 42 exhibit a square law characteristic.

Input signals are coupled to the gate electrodes 54 and 56 through coupling capacitors 62 and 64 from a phase splitter circuit which includes an NPN transistor 66. The signals coupled to the field-effect transistors 40 and 42 are of equal amplitude but opposite phase. An input signal is coupled through the coupling capacitor 68 to the base electrode 70 of the transistor 66. The base electrode 70 of the transistor 66 is biased to a desired bias potential by means of a voltage divider network including resistors 72 and 74 connected in series between the source of bias potential $+E_1$ and ground. The collector electrode 76 and the emitter electrode 78 are respectively connected to the source of bias potential $+E_1$ and ground through resistors 80 and 82. The signals coupled to the field-effect transistors 40 and 42 are derived respectively from the collector electrode 76 and the emitter electrode 78 of the transistor 66 to apply signals to the field-effect transistors 40 and 42 in push-pull relation. The value of the resistors 80 and 82 are such that the signals derived from the collector and emitter electrodes of the transistor 66 are of equal amplitude. A power amplifier stage including a NPN transistor 84 is coupled to the drain electrodes 44 and 46 of the field-effect transistors 40 and 42 by a direct connection between the drain electrodes 44 and 46 and the base electrode 85. The emitter electrode 86 is coupled through a resistor 88 to ground, and the collector electrode 90 is directly coupled to the source of bias potential $+E_1$.

Figure 6:
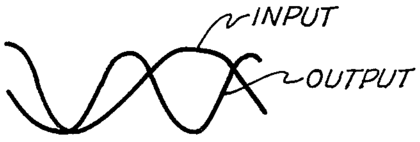
FIGURE 6 is a graph showing the input and output signal wave forms of the frequency doubler circuit of FIGURE 7 embodying the invention.

The output signal from the power amplifier stage is derived across the resistor 88. FIGURE 6 shows the input signal applied to the phase splitter and the output signal derived from the power amplifier stage as seen in the screen of an oscilloscope. As it is shown in FIGURE 6, the output signal is substantially a pure sine wave, which is especially important when several stages of frequency multiplication are used in cascade because the distortion in any one stage is magnified by succeeding stages of frequency multiplication.

In operation, an input signal of a predetermined frequency is applied between the base electrode 70 and ground through a coupling capacitor 68. Signals having equal amplitude and opposite phase are derived from the collector electrode 76 and the emitter electrode 78 of the transistor 66. The signals derived from the phase splitter are coupled to the gate electrodes 54 and 56 of the field-effect transistors 40 and 42. Because the drain electrodes 44 and 46 of the field-effect transistors 40 and 42 are connected in parallel and the gate electrodes are driven push-pull, the fundamental components of the drain current versus gate voltage characteristic of the insulated-gate field-effect transistors 40 and 42 cancel each other. The gate electrode 54 is driven by a signal $=b \cos \omega t$, while the gate electrode 56 is driven by a signal $=-b \cos \omega t$ which add algebraically in the output cancelling each other.

Due to the square law characteristic of the field-effect transistors 40 and 42, the second order term of each of their signal transfer characteristics appear with the same sign at the output circuit thereby adding to each other.

The other higher order harmonic components add to and subtract from each other algebraically in the same manner previously explained in reference to the fundamental and second harmonic components, however, due to the increasingly smaller amplitudes of the higher order harmonics, the output signal is substantially free of the higher order harmonic distortion.

The typical values of the circuit shown in FIGURE 7 are as follows:

Resistors, ohms:
- 72=56,000
- 74=27,000
- 80=5,600
- 82=5,600
- 60=56,000
- 58=56,000
- 48=15,000
- 88=10,000

Capacitors, microfarad:
- 68=.01
- 62=.01
- 64=.01

Transistors:
- 66=2N338
- 84=2N338

Voltages, volts:
- $E_1=+20$
- $-E_2=-7.5$
- $-E_3=-7.5$

Applying an input signal having a frequency of 10 kilocycles/second to the input terminals of the frequency doubler circuit result in relative amplitudes of signals at the output electrode 86 as follows:

Fundamental=−35.9 db relative to the amplitude of the second harmonic (20 kilocycles/sec.)
Third harmonic=−37.1 db relative to the amplitude of the second harmonic
Fourth harmonic=−30.4 db relative to the amplitude of the second harmonic
Fifth harmonic =−46 db relative to the amplitude of the second harmonic
Sixth harmonic =−57 db relative to the amplitude of the second harmonic.

The circuit shown in FIGURE 7 may also be used as a mixer circuit by applying two signals A and B of different frequencies to the terminals *a* and *b* which are coupled through resistors 92 and 90 (shown in dotted lines) to the coupling capacitor 68. The signals A and B are derived from the emitter electrode 78 of the transistor 66 and are coupled to the gate electrode 56 of the field-effect transistor 42. The signals derived from the collector electrode 76 of the transistor 66 are coupled through a coupling capacitor 62 to the gate electrode 54 of the field-effect transistor 40. The signals applied to the gate electrode 54 are signals having the same amplitude as the signals A and B but are 180° out of phase. For the reasons given above, the signal output wave derived from the drain electrodes 46 and 44 of the field-effect transistors 40 and 42 comprises the second harmonic component of the fundamental frequencies applied to terminals *a* and *b*. In addition, because of the nonlinear characteristic of the field-effect transistors 40 and 42 the output signal wave contains the sum and difference frequencies of the input signals applied.

The result obtained from using the circuits shown in FIGURE 7 as a mixer circuit were as follows: the fundamental frequencies A (7 kilocycles/sec.) and B (10 kilocycles/sec.) were substantially cancelled, the second harmonic of A (14 kilocycles/sec.) was 38%, the second harmonic of B was 42%, the sum frequency $A+B$ (17 kilocycles/sec.) was 87%, and the difference frequency $B-A$ (3 kilocycles/sec.) was 91%. The percent values given are relative to the amplitude of the signals A and B (equal amplitude) measured respectively between the gate electrodes 54 and 56 and ground. The desired output frequency may be obtained by means of a suitable filter circuit, not shown, coupled across the output circuit resistor 88.

What is claimed is:

1. In combination,
first and second semiconductor devices each having input, output and common electrodes and exhibiting a square law signal transfer characteristic,
input circuit means coupled to apply input signals to said input electrodes in push-pull relation,
means coupling said common electrodes to a point of reference potential,
biasing circuit means for applying a bias voltage between the input and common electrodes of said first and second devices to operate said first and second devices to exhibit said square law signal transfer characteristic, and
load circuit means coupled to said output electrodes of said first and second devices to derive an output signal which has twice the frequency of said input signal.

2. In combination,
first and second field-effect semiconductor devices each having first and second electrodes formed on a substrate of semiconductor material and a gate electrode being insulated from said substrate, said first and second electrodes being connected to each other by a conductive channel,
circuit means for connecting respectively said first electrodes and said second electrodes to each other,
circuit means coupled to said gate electrodes of said first and second field-effect semiconductor devices for applying input signals in a push-pull relation,
biasing circuit means coupled to said gate electrodes of said first and second field-effect semiconductor devices to cause said first and second field-effect semiconductor devices to exhibit a square law signal characteristic, and
output circuit means coupled to said first electrodes of said first and second field-effect semiconductor devices to derive an output signal which is the second harmonic of said input signals.

3. In combination,
first and second insulated-gate field-effect transistors each having input, output and common electrodes formed on a substrate of semiconductor material, each of said transistors having signal transfer characteristic which is substantially a square law characteristic,
circuit means coupled to said input electrodes for respectively biasing said first and second insulated-gate field-effect transistors to a predetermined point in its corresponding signal transfer characteristic,
circuit means coupling said common electrodes of said field-effect transistors to each other,
input circuit means coupled to said input electrodes of said first and second field-effect transistors for connecting said input electrodes in a push-pull relation, and
output circuit means coupled to said output electrodes for connecting said output electrodes in push-push relation so that only the second harmonic of said input signals is derived from said output circuit means.

4. In combination, first and second insulated-gate field-effect transistors each having drain, source and gate electrodes formed on a substrate of semiconductor material, circuit means for connecting said source electrodes of said first and second field-effect semiconductor devices to each other, circuit means for applying a bias voltage between said gate and source electrodes, a phase splitter circuit, including a transistor having base, emitter and collector electrodes, coupled to said gate electrode, means for applying an input signal between said base and emitter electrodes of said transistor, means respectively coupled between said emitter and collector electrodes and said gate electrodes for applying signals of opposite phase to said field-effect transistors, and output circuit means coupled to said drain electrodes for deriving an output signal which is the second harmonic of said input signal.

5. A mixer circuit comprising first and second insulated-gate field-effect transistors each having gate, drain and source electrodes formed on a substrate of semiconductor material, each of said first and second field-effect transistors having a signal transfer characteristic that is substantially a square law characteristic, biasing circuit means respectively coupled between said gate and source electrodes of said first and second field-effect transistors for biasing said transistors to a predetermined point of the corresponding signal transfer characteristic, input circuit means coupled between said gate and source electrodes of said first and second field-effect transistors for applying input signals to said mixer circuit, said input signals applied to said first transistor having a different frequency, said input signals applied to said second transistor respectively having the same frequency of the input signals applied to said first transistor and 180° phase relation with the input signals applied to said first transistor which correspond in frequency, and output circuit means coupled respectively between said drain and source electrodes of said first and second field-effect transistors to derive the sum and difference frequencies of said input signals.

References Cited by the Examiner

UNITED STATES PATENTS 3,093,752 6/63 Christensen ----------- 307—88.5

ARTHUR GAUSS, *Primary Examiner.*